United States Patent
Nishio

(10) Patent No.: US 6,525,548 B1
(45) Date of Patent: Feb. 25, 2003

(54) CHECK PATTERN FOR A SEMICONDUCTOR DEVICE

(75) Inventor: Nobuya Nishio, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/710,597

(22) Filed: Nov. 10, 2000

(30) Foreign Application Priority Data

Nov. 12, 1999 (JP) ............................................. 11-321941

(51) Int. Cl.$^7$ .............................................. G01R 27/08
(52) U.S. Cl. ....................................... 324/699; 324/719
(58) Field of Search ................................ 324/699, 713, 324/715, 716, 719, 691, 537

(56) References Cited

U.S. PATENT DOCUMENTS

| | | | | |
|---|---|---|---|---|
| 5,640,097 A | * | 6/1997 | Hada ........................... | 324/713 |
| 5,777,486 A | * | 7/1998 | Hsu .......................... | 324/719 X |
| 5,900,735 A | * | 5/1999 | Yamamoto ................... | 324/537 |
| 6,022,644 A | * | 2/2000 | Lin et al. ....................... | 430/5 |
| 6,127,733 A | | 10/2000 | Kinoshita .................... | 257/773 |
| 6,353,235 B1 | * | 3/2002 | Watanabe ..................... | 257/48 |

* cited by examiner

Primary Examiner—Christine Oda
Assistant Examiner—T. R. Sundaram
(74) Attorney, Agent, or Firm—Scully, Scott, Murphy & Presser

(57) ABSTRACT

The present invention provides a check pattern for evaluating the result of via openings during fabrication of a semiconductor device. The check pattern uses a Wheatstone bridge circuit so as to eliminate any influence of variation of wiring resistance and/or contact resistance. In the bridge circuit, four terminals are provided, namely first, second, third and fourth terminals. Each of four sides of the bridge circuit is defined by connecting an upper conductor layer including one terminal, a sub-group of via openings belonging to one group, a lower conductor layer, the other sub-group of via openings belonging to the same group, and an upper conductor layer including another terminal.

3 Claims, 3 Drawing Sheets

CHECK PATTERN FOR A SEMICONDUCTOR DEVICE

BACKGROUND OF THE INVENTION

1. Field of the Invention

The present invention relates to a check pattern for a semiconductor device, and more particularly to a check pattern for evaluating the result of via openings during fabrication of semiconductor devices.

2. Terminology

Via Opening

This is herein used to mean a through hole and a contact hole which are formed during fabrication of semiconductor devices.

3. Description of the Related Art

A known manner of evaluating the result of via openings is to measure electrical resistance of a pattern connecting such via openings in series.

FIG. 3 provides one example of a known check pattern for evaluating via openings. The check pattern connects via openings in series. As illustrated in FIG. 3, a via opening 101 interconnects an upper layer 111 of conductor lines and a lower layer 121 of conductor line. Within the upper layer 111, a terminal E is connected to the conductor lines. A via opening 102 interconnects the lower layer 121 and an upper layer 112 of conductor lines. A via opening 103 interconnects the upper layer 112 and a lower layer 122 of conductor lines. A via opening 104 interconnects the lower layer 122 and an upper layer 113 of conductor lines. A via opening 105 interconnects the upper layer 113 and a lower layer 123 of conductor lines. A via opening 106 interconnects the lower layer 123 and an upper layer 114 of conductor lines. Within the upper layer 114, a terminal F is connected to the conductor lines. In this manner, the pattern interconnects the terminals E and F.

A conventional measuring method using this check pattern may receive an influence due to variation of wiring resistance and/or contact resistance between measuring probes and terminals, and involves difficulty in detecting, with good accuracy, a small variation of resistance via openings.

An object of the present invention is to provide a check pattern for a semiconductor device, with which a small variation of resistance of via opening can be detected without receiving any influence due to variation of wiring resistance and/or contact resistance between measuring probes and terminals.

SUMMARY OF THE INVENTION

According to one exemplary implementation of the invention, there is provided a check pattern for a semiconductor device comprising a plurality groups of via openings, each group interconnecting first and second conductor layer means to define one side of a Wheatstone bridge circuit.

According to the specific aspect of the present invention, the bridge circuit includes a first terminal, a second terminal, a third terminal, and a fourth terminal.

The bridge circuit includes a first group of via openings consisting of a first sub-group and a second sub-group. The first sub-group of the first group interconnects a first upper conductor layer including the first terminal and a first lower conductor layer. The second sub-group of the first group interconnects the first lower conductor layer and a second upper conductor layer including the second terminal. The first upper conductor layer, the first group of via openings, the first lower conductor layer and the second upper conductor layer cooperate with each other to provide first resistance of a first electrical path interconnecting the first and second terminals.

The bridge circuit also includes a second group of via openings consisting of a first sub-group and a second sub-group. The first sub-group of the second group interconnects the second upper conductor layer and a second lower conductor layer. The second sub-group of the second group interconnects the second lower conductor layer and a third upper conductor layer including the third terminal. The second upper conductor layer, the second group of via openings, the second lower conductor layer and the third upper conductor layer cooperate with each other to provide second resistance of a second electrical path interconnecting the second and third terminals.

The bridge circuit includes a third group of via openings consisting of a first sub-group and a second sub-group, The first sub-group of the third group interconnects the first upper conductor layer and a third lower conductor layer. The second sub-group of the third group interconnects the third is lower conductor layer and a fourth upper conductor layer including the fourth terminal. The first upper conductor layer, the third group of via openings, the third lower conductor layer and the fourth upper conductor layer cooperate with each other to provide third resistance of a third electrical path interconnecting said first and fourth terminals.

The bridge circuit includes a fourth group of via openings consisting of a first sub-group and a second sub-group. The first sub-group of the fourth group interconnects the fourth upper conductor layer and a fourth lower conductor layer. The second sub-group of the fourth group interconnects the fourth lower conductor layer and the third upper conductor layer. The fourth upper conductor layer, the fourth group of via openings, the fourth lower conductor layer and the third upper conductor layer cooperate with each other to provide fourth resistance of a fourth electrical path interconnecting the fourth and third terminals.

BRIEF DESCRIPTION OF THE DRAWINGS

The foregoing and other objects, features and advantages of the invention will be apparent from the following more particular description of exemplary embodiment of he invention as illustrated in She accompanying drawings. The drawings are not necessarily scale, emphasis instead being placed upon illustrating the principles of the invention.

DESCRIPTION OF THE PREFERRED EMBODIMENT

Figure 1:
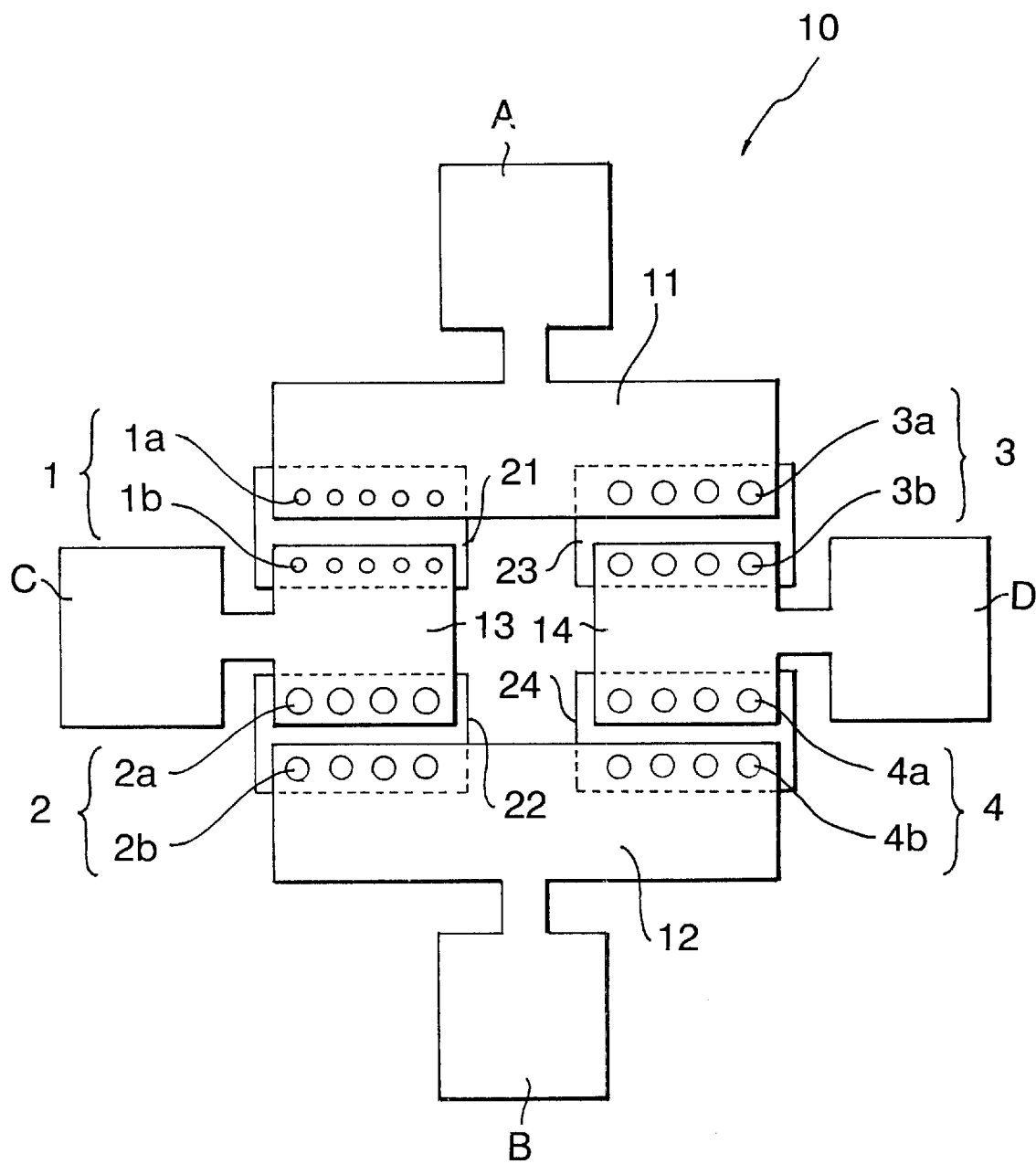
FIG. 1 is a pictorial view of a check pattern for evaluating via openings of a semiconductor device according to the present

Referring to FIG. 1, in a preferred embodiment, the present invention is applied to through holes interconnecting layers of conductor lines. However, the present invention may be equally applicable to interlayer contact holes between gate regions and diffusion regions.

In the preferred embodiment, the check pattern uses a Wheatstone bridge circuit. In the bridge circuit, four terminals are provided, namely first, second, third and fourth terminals. Each of four sides is defined by connecting an upper layer of conductor lines including one terminal, a sub-group of via openings belonging to a group, a lower layer of conductor lines, another sub-group of the via openings belonging to the group, and an upper layer of conductor lines including another terminal.

In FIG. 1, a first electrical path with resistance R1 includes a first group of via openings generally indicated by the reference numeral 1. The first group 1 consists of a first sub-group 1a of via openings and a second sub-group 1b of via 30 openings, The first group 1 of via openings interconnect an upper layer 11 of conductor lines including a terminal A, a lower layer 21 of conductor lines, and an upper layer 13 of conductor lines including a terminal C. The first sub-group 1a of via openings interconnect the upper layer 11 and the lower layer 21. The second sub-group 1b of via openings interconnect the lower layer 21 and the upper layer 13. The upper conductor layer 11, the first sub-group 1a of via openings, the lower conductor layer 21, the second sub-group 1b of via openings and the upper conductor layer 13 cooperate with each other to provide the resistance R1.

Likewise, a second electrical path with resistance R2 includes a second group of via openings generally indicated by the reference numeral 2. The second group 1 consists of a first sub-group 2a of via openings and a second sub-group 2b of via openings. The second group 2 of via openings interconnect the upper layer 13 with terminal C, a lower layer 22 of conductor lines, and an upper layer 12 of conductor lines including a terminal B. The first sub-group 2a of via openings interconnect the upper layer 13 and the lower layer 22. The second sub-group 2b of via openings interconnect the lower layer 22 and the upper layer 12. The upper conductor layer 13, the first sub-group 2a of via openings, the lower conductor layer 22, the second sub-group 2b of via openings and the upper conductor layer 12 cooperate with each other to provide the resistance R2.

A third electrical path with resistance R3 includes a third group of via openings generally indicated by the reference numeral 3. The third group 3 consists of a first sub-group 3a of via openings and a second sub-group 3b of via openings. The third group 3 of via openings interconnect the upper layer 11 with terminal A, a lower layer 23 of conductor lines, and an upper layer 14 of conductor lines including a terminal D. The first sub-group 3a of via openings interconnect the upper layer 11 and the lower layer 23. The second sub-group 3b of via openings interconnect the lower layer 23 and the upper layer 14. The upper conductor layer 11, the first sub-group 3a of via openings, the lower conductor layer 23, the second sub-group 3b of via openings and the upper conductor layer 14 cooperate with each other to provide the resistance R3.

A fourth electrical path with resistance R4 includes a fourth group of via openings generally indicated by the reference numeral 4. The fourth group 4 consists of a first sub-group 4a of via openings and a second sub-group 4b of via openings. The fourth group 4 of via openings interconnect the upper layer 14 with terminal D, a lower layer 24 of conductor lines, and the upper layer 12 with terminal B. The first sub-group 4a of via openings interconnect the upper layer 14 and the lower layer 24. The second sub-group 4b of via openings interconnect the lower layer 24 and the upper layer 12.

As described, the electrical paths with resistance R1, R2, R3 and R4 form four sides of a Wheatstone bridge 10. The upper conductor layer 14, the first sub-group 4a of via openings, the lower conductor layer 24, the second sub-group 4b of via openings and the upper conductor layer 12 cooperate with each other to provide the resistance R4.

The check pattern is designed so that lower layer means and upper layer means of conductor lines between the terminals A and C, between C and B, between A and D, and between D and B are of the same electrical resistance.

With regard to the number and dimensions of via openings, via openings of the second, third and fourth groups 2, 3 and 4 have the same number of via openings of the same diameter. The first group 1 have via openings, each having the diameter different from that of the via openings of the second, third and fourth groups 2, 3 and 4 for allowing appearance of influence due to process variation.

In the preferred embodiment, the first group 1 has ten (10) via openings, each having a diameter of 0.18 μm, that are divided into five (5) via openings belonging to the first sub-group 1a and the other five (5) belonging to the second sub-group 1b. The via openings of each of the first and second sub-groups 1a and 1b are connected in parallel. Each of the via openings of he first sub-group 1a and one of the via openings of the second sub-group 1b are connected in series.

Each of the second, third and fourth groups 2, 3 and 4 has eight (8) via openings, each having a diameter of 0.2 μm, that are divided into four (4) via openings belonging to the first sub-group 2a or 3a or 4a and the other four (4) belonging to the second sub-group 2b or 3b or 4b. The via openings of each of the first and second sub-groups of each of the groups 2, 3 and 4 are connected in parallel. Each of the via openings of the firs sub-group and one of the via openings of the second sub-group of each of the groups 2, 3 and 4 are connected in series.

Figure 2:
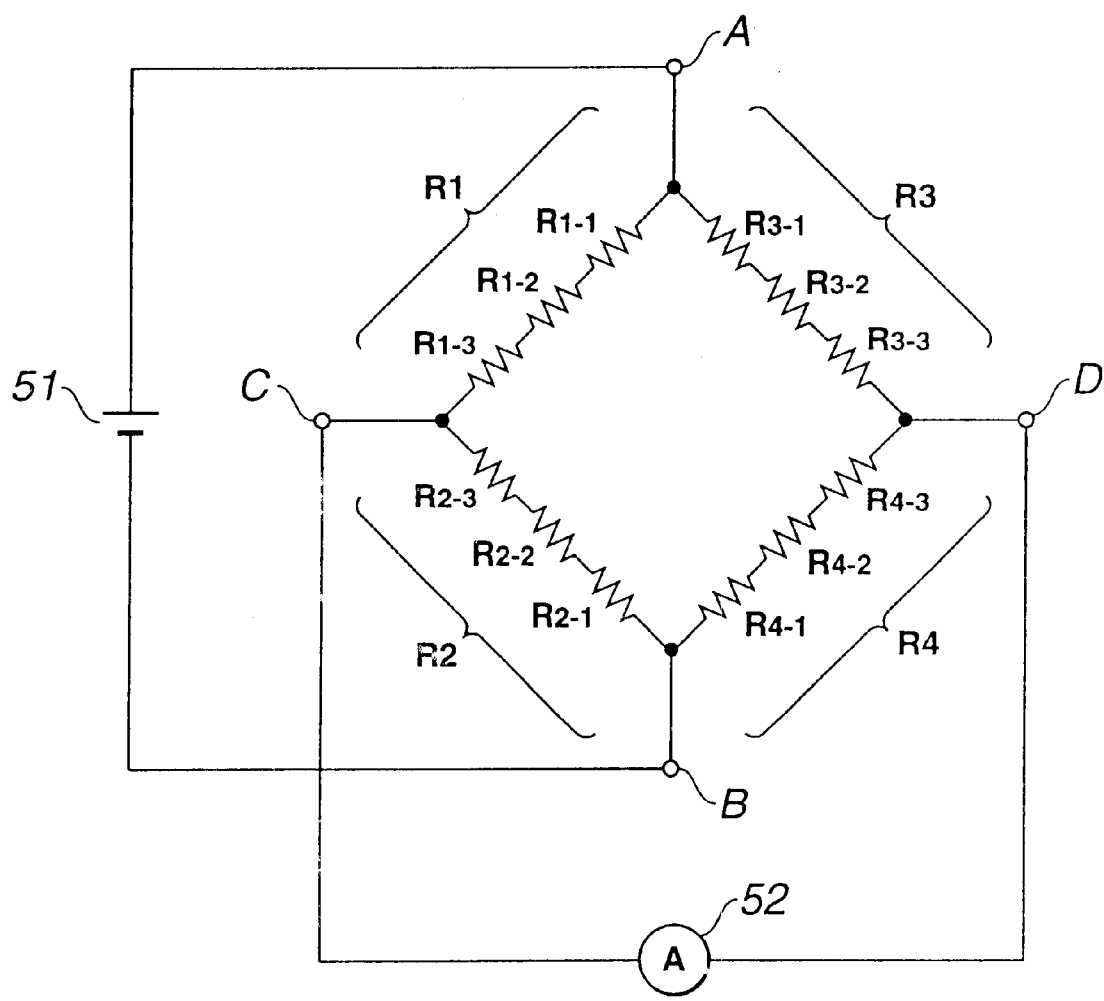
FIG. 2 is a circuit diagram for the check pattern.
Figure 3:
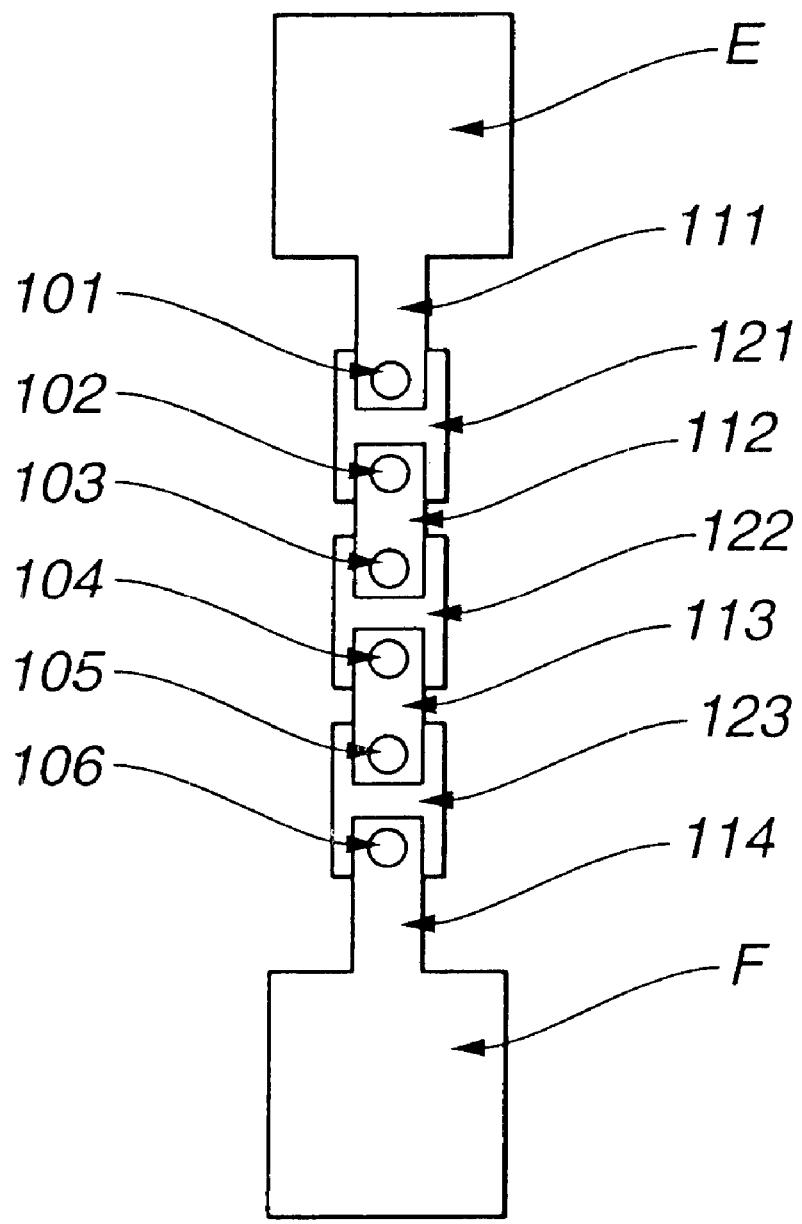
FIG. 3 is a pictorial view of a check pattern according to the prior art.

FIG. 2 shows a circuit for the check pattern.

In FIG. 2, between the terminals A and C, the reference character $R_{1-1}$ represents resistance of the upper layers 11 and 13. The reference character $R_{1-3}$ represents resistance of the lower layer 21. The reference character $R_{1-2}$ represents resistance of the via openings of the first group 1. The total of $R_{1-1}$, $R_{1-2}$ and $R_{1-3}$ is the first resistance R1.

Between the terminals C and B, the reference character $R_{2-1}$ represents resistance of the upper layers 13 and 12. The reference character $R_{2-3}$ represents resistance of the lower layer 22. The reference character $R_{2-2}$ represents resistance of the via openings of the second group 2. The total of $R_{2-1}$, $R_{2-2}$ and $R_{2-3}$ is the second resistance R2.

Between the terminals A and D, the reference character $R_{3-1}$ represents resistance of the upper layers 11 and 14. The reference character $R_{3-3}$ represents resistance of the lower layer 23. The reference character $R_{3-2}$ represents resistance of the via openings of the third group 3. The total of $R_{3-1}$, $R_{3-2}$ and $R_{3-3}$ is the third resistance R3.

Between the terminals D and B, the reference character $R_{4-1}$ represents resistance of the upper layers 14 and 12. The reference character $R_{4-3}$ represents resistance of the lower layer 24. The reference character $R_{4-2}$ represents resistance of the via openings of the third group 4. The total of $R_{4-1}$, $R_{4-2}$, and $R_{4-3}$ is the fourth resistance R4.

With voltage applied across the terminal A and B by a source of electric voltage 51, current passing through the terminals C and D is measured by an ammeter 52.

In the preferred embodiment, the check pattern is designed such that wiring resistance between the terminals of one of the four sides of the bridge is equal to that of the terminals of any one of the other three sides. Under this condition, variation of wiring resistance is equally applied to all of the four sides of the bridge. Thus, resistance of via openings determines balanced state of the bridge.

The following description proceeds with the case where a difference in resistance of each of via openings depends upon the opening area of the via opening only. The other factors including the depth of each of the via openings are negligible because they are common among all of the via openings.

In the circuit shown in FIG. 2, if R1: R2=R3: R4, no current passes between the terminals C and D.

If R1: R2>R3: R4, current passes from the terminal D to the terminal C. If R1: R2<R3: R4, current passes from the terminal C to the terminal D.

Since R2=R3=R4, current passes from the terminal D to the terminal C if R1>R2, while current passes from the terminal C to the terminal D if R1<R2.

Since $R_{1-1}=R_{2-1}$ and $R_{1-3}=R_{2-3}$, a ratio between $R_{1-2}$ (resistance of via openings of the group 1) and $R_{2-2}$ (resistance of the via openings of the group 2) determines the direction in which current passes.

In the preferred embodiment shown in FIG. 1, the first group 1 consists of first and second sub-groups 1a and 1b. Each of the first and second sub-groups 1a and 1b consists of five parallel via openings, each having a diameter of 0.18 μm. Each of the via openings of the first sub-group 1a and one of the via openings of the second sub-group 1b are connected in series. Each of the first and second sub-groups of each of the second, third and fourth groups 2, 3 and 4 consists of four parallel via openings, each having a diameter of 0.20 μm. Each of the via openings of the first sub-group 2a or 3a or 4a and one of the via openings of the second sub-group 2b or 3n or 4b are connected in series. Thus, the ratio, in resistance, between the first, second, third and fourth groups 1, 2, 3 and 4 of via openings is determined by a ratio between the total opening area of the via openings of the first group 1, that of the second group 2, that of the third group 3 and that of the fourth group 4.

Let it be assumed that all of the via openings are formed as designed. Then, the total of opening areas of the via openings of the first group 1 amounts to 0.127 μm² because each via opening has 0.18 μm in diameter. The total of opening areas of the via openings of the second group 2 amounts to 0.126 μm². Thus, the total area of the first group 1 is greater than the total area of the second group 2. This means that resistance $R_{1-2}$ of the via openings of the first group 1 is less than the resistance $R_{2-2}$ of the via openings of the second group 2. Therefore, under this condition, current passes from the terminal C to the terminal D.

The following Table depicts how the ratio between the total area of the first group 1 and that of the second group 2 changes if the diameter of the via openings of the first group 1 is decreased from 0.18 μm by 0.001 μm and the diameter of the via openings of the second group 2 is decreased from 0.20 μm by 0.001 μm.

TABLE

| | Diameter (μm) | | Total Area | | |
|---|---|---|---|---|---|
| | Group 1 | Group 2 | Group 1 | Group 2 | Area Ratio |
| (1) | 0.180 | 0.200 | 0.12723 | 0.12566 | 1.013 |
| (2) | 0.179 | 0.199 | 0.12582 | 0.12441 | 1.011 |
| (3) | 0.178 | 0.198 | 0.12442 | 0.12316 | 1.010 |
| (4) | 0.177 | 0.197 | 0.12303 | 0.12192 | 1.009 |
| (5) | 0.176 | 0.196 | 0.12164 | 0.12069 | 1.008 |
| (6) | 0.175 | 0.195 | 0.12026 | 0.11946 | 1.007 |
| (7) | 0.174 | 0.194 | 0.11889 | 0.11824 | 1.006 |
| (8) | 0.173 | 0.193 | 0.11753 | 0.11702 | 1.004 |
| (9) | 0.172 | 0.192 | 0.11618 | 0.11581 | 1.003 |
| (10) | 0.171 | 0.191 | 0.11483 | 0.11461 | 1.002 |
| (11) | 0.170 | 0.190 | 0.11349 | 0.11341 | 1.001 |
| (12) | 0.169 | 0.189 | 0.11216 | 0.11222 | 0.999 |
| (13) | 0.168 | 0.188 | 0.11024 | 0.11104 | 0.998 |
| (14) | 0.167 | 0.187 | 0.10952 | 0.10986 | 0.997 |
| (15) | 0.166 | 0.186 | 0.10821 | 0.10869 | 0.996 |
| (16) | 0.165 | 0.185 | 0.10691 | 0.10752 | 0.994 |
| (17) | 0.164 | 0.184 | 0.10562 | 0.10636 | 0.993 |
| (18) | 0.163 | 0.183 | 0.10434 | 0.10521 | 0.992 |
| (19) | 0.162 | 0.182 | 0.10306 | 0.10406 | 0.990 |
| (20) | 0.161 | 0.181 | 0.10179 | 0.10292 | 0.989 |
| (21) | 0.160 | 0.180 | 0.10053 | 0.10179 | 0.988 |

In examples (1) to (11), the total opening area of via openings of the first group 1 is greater than that of the second group 2 and thus the resistance $R_{1-2}$ of the first group 1 is less than the resistance $R_{2-2}$ of the second group 2. Under these conditions, current passes in a direction from the terminal C to the terminal D. In examples (12) to (21), the total opening area of via openings of the firsts group 1 is less than that of the second group 2 and thus the resistance $R_{1-2}$ of the first group 1 is greater than the resistance $R_{2-2}$ of the second group 2. Under these conditions, current passes in the opposite direction from the terminal D to the terminal C.

As readily seen from the Table, if the diameter of each of via openings is reduced from its design value by more than 0.01 μm, the total opening area of the via openings of the first group 1 is exceeded by that of the second group 2 and $R_{1-2}>R_{2-2}$ holds. Thus, the direction of current is reversed and current will pass in the opposite direction from the terminal D to the terminal C.

In this manner, a small reduction in diameter can be clearly indicated as a change in direction of current from one to the opposite direction.

Using the bridge is effective in excluding the influence of contacting resistance between probe and terminal.

In the above explanation of the operation of the preferred embodiment, it has been assumed that the variation of resistance is caused by the variation of diameter of each of via openings only. In the actual via openings, other causes, such as, a change in step coverage, of variations of resistance of the via openings must be taken into account. According to the check pattern, such other causes can be indicated with good precision.

With the same structure, altering the diameter and the number of via openings only makes it possible to reverse the direction of current between the terminals C and D when the diameter of via openings is increased.

Providing a plurality of different check patterns, in the diameter and number of via openings, makes it possible to determine whether resistance of via openings is at 0 level (below the standards) or at 1 level (above the standards). This provides increased accuracy in automatic judgement using an auto-prober.

Although in the preferred embodiment, only the first group 1 of via openings is different from each of the other three groups 2, 3 and 4. In other words, the other three groups of via openings are the same. Alternatively, it is possible to have a check pattern of the same effectiveness if the two groups of via openings on the opposite sides of the bridge are the same. For example, the first group 1 of via openings between the terminals A and C and the fourth group 4 of via openings between the terminals D and B are the same, and the second group 2 of via openings between the terminals C and B and the third group via openings between the terminals A and D are the same.

The check pattern according to the present invention is used for a semiconductor device. The check pattern is free from variations in material and/or structure of an upper or a lower conductor layer. Further, the check pattern according to the present invention is free from variation in fabrication of via openings, such as, embedding via openings independently from forming an upper layer or embedding via openings simultaneously with forming an upper layer.

While the present invention has been particularly described, in conjunction with one preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A check pattern for a semiconductor device, the check pattern comprising:

a first group of a predetermined number of via openings to be checked, a second group of via openings, a third group of via openings, and a fourth group of via openings, each group interconnecting first and second conductor layers to define one side of four sides of a Wheatstone bridge circuit, the second, third and fourth groups having the same number of via openings, each having the same diameter so that the total of opening areas of the via openings of each of the second, third and fourth groups is common, the total of opening areas of the via openings of each of the second, third and fourth groups being deviated by a predetermined amount, in one direction, from a predetermined total of opening areas of the predetermined number of via openings, each being formed as designed and having a desired diameter, whereby, current passing through the Wheatstone circuit changes in direction when the diameter of each of the via openings to be checked is different from the desired diameter such that the total of opening areas of the via openings to be checked is deviated beyond the predetermined amount, in the same direction, from the predetermined total of opening areas of the via openings, each being formed as designed and having the desired diameter.

2. The check pattern as claimed in claim 1, wherein the predetermined total is greater than the total of opening areas of the via openings of each of the second, third and fourth groups.

3. The check pattern as claimed in claim 1, wherein the desired diameter is 0.18 $\mu$m and the predetermined number is ten, and wherein the diameter of each of the via openings of the second, third and fourth groups is 0.20 $\mu$m and the number of via openings of each of the second, third and fourth groups is eight, and wherein the predetermined amount is 0.00157 $\mu m^2$.

* * * * *